(12) United States Patent
Jain

(10) Patent No.: US 11,309,994 B2
(45) Date of Patent: Apr. 19, 2022

(54) HIGHLY PARALLEL AND SCALABLE CYCLIC REDUNDANCY CHECK

(71) Applicant: INFINERA CORPORATION, Sunnyvale, CA (US)

(72) Inventor: Ashok Jain, Bangalore (IN)

(73) Assignee: Infinera Corporation, San Jose, CA (US)

( * ) Notice: Subject to any disclaimer, the term of this patent is extended or adjusted under 35 U.S.C. 154(b) by 1228 days.

(21) Appl. No.: 15/386,415

(22) Filed: Dec. 21, 2016

(65) Prior Publication Data

US 2021/0314088 A1    Oct. 7, 2021

(51) Int. Cl.
*H04L 1/00* (2006.01)

(52) U.S. Cl.
CPC .................... *H04L 1/0061* (2013.01)

(58) Field of Classification Search
CPC ..................... G06F 11/1004; H04L 1/0061
See application file for complete search history.

(56) References Cited

U.S. PATENT DOCUMENTS

| | | | |
|---|---|---|---|
| 8,539,326 B1* | 9/2013 | Nethercot | G06F 11/10 714/807 |
| 2008/0162833 A1* | 7/2008 | Chung | G06F 11/1004 711/154 |
| 2009/0006921 A1* | 1/2009 | Engberg | H03M 13/6575 714/752 |
| 2012/0173952 A1* | 7/2012 | Kumar | G06F 11/1004 714/758 |

* cited by examiner

*Primary Examiner* — Khanh C Tran
(74) *Attorney, Agent, or Firm* — David L. Soltz

(57) ABSTRACT

Techniques for calculation of CRC values for very large Ethernet packets in a quick manner are disclosed. Portions of CRC values are calculated each frame and are combined to arrive at a final CRC value for the frame. The CRC values for each frame are also combined to arrive at the final value for the packet. The use of the zero-wheeling function allows for each CRC value calculation to be a calculation of a limited set of data (e.g., one chunk of a frame), which allows such calculations to be completed quickly.

20 Claims, 7 Drawing Sheets

HIGHLY PARALLEL AND SCALABLE CYCLIC REDUNDANCY CHECK

FIELD OF INVENTION

The present disclosure is directed, generally, to message integrity verification, and, more specifically, to techniques for performing highly parallel and scalable cyclic redundancy check.

BACKGROUND

Cyclic redundancy check ("CRC") is a technique for verifying the integrity of the contents of a message. To verify a message using CRC, a message first has a CRC value calculated. The CRC value is then sent along with the message to a destination. The destination calculates another CRC value based on the message and compares the calculated CRC value. If the calculated CRC value is equal to the received CRC value, then the message is verified and if the CRC values are different, then an error is deemed to have occurred.

One area in which CRC message verification is used is message transmission via Ethernet. The mechanisms involved in Ethernet communication calculate and verify CRC values for each Ethernet packet transmitted. At higher data transmission rates, CRC values may be required to be calculated at higher speeds.

SUMMARY

A method for determining a final cyclic redundancy check ("CRC") value of a multi-frame packet is disclosed. The method includes generating a first CRC value for a first frame of the multi-frame packet. The method also includes converting the first CRC value to a first zero-wheeled CRC value. The method further includes generating a second CRC value for a second frame of the multi-frame packet. The method also includes outputting the final CRC value for the multi-frame packet that is based on the first zero-wheeled CRC value and the second zero-wheeled CRC value.

A cyclic redundancy check circuit for determining a CRC of a multi-frame packet is disclosed. The cyclic redundancy check circuit includes a first stage configured to generate a first CRC value for a first frame of the multi-frame packet and to generate a second CRC value for a second frame of the multi-frame packet. The cyclic redundancy check circuit also includes a second stage configured to convert the first CRC value to a first zero-wheeled CRC value. The final CRC value for the multi-frame packet is based on the first zero-wheeled CRC value and the second CRC value.

A non-transitory computer-readable medium that, when executed by a processor, causes the processor to perform a method for determining a final cyclic redundancy check ("CRC") value of a multi-frame packet is also disclosed. The method includes generating a first CRC value for a first frame of the multi-frame packet. The method also includes converting the first CRC value to a first zero-wheeled CRC value. The method further includes generating a second CRC value for a second frame of the multi-frame packet. The method also includes outputting the final CRC value for the multi-frame packet that is based on the first zero-wheeled CRC value and the second zero-wheeled CRC value.

BRIEF DESCRIPTION OF THE DRAWINGS

A more detailed understanding may be had from the following description, given by way of example in conjunction with the accompanying drawings wherein.

DETAILED DESCRIPTION

The present disclosure provides techniques for calculation of a cyclic redundancy check ("CRC") value for multi-frame Ethernet packets (i.e., packets that are transmitted over a plurality of Ethernet frames) and for Ethernet packets with large-sized frames (e.g., 1024 bits). The techniques are generally embodied as a pipelined processing mechanism having at least two stages for calculation of the CRC value in different portions (i.e., portions of the CRC value) and for combination of the portions of the CRC value into a final CRC value for the entire packet. A first stage of the pipeline calculates a CRC value for a single "current" frame of the packet. A second stage of the pipeline calculates and accumulates a "running CRC value" that represents the CRC value for all frames prior to the current frame.

Figure 6:
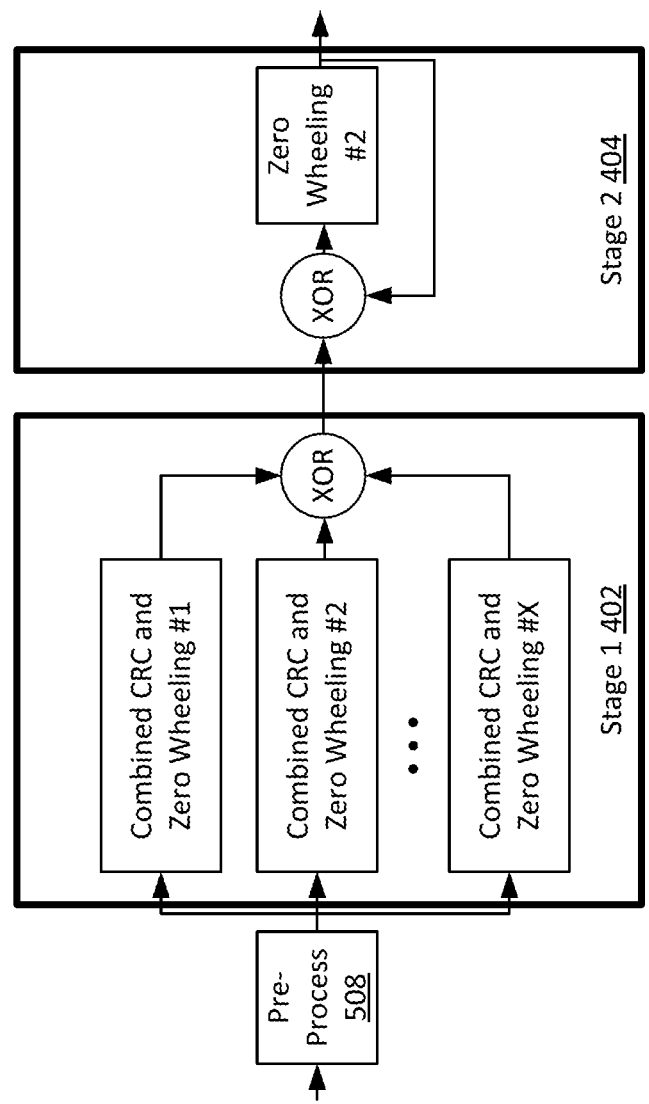
FIG. 6 is a CRC circuit according to another example.

A third stage, which is optional, but is used when data for the packet in the last frame is not aligned with the last byte of that frame (see, e.g., FIG. 3, frame 340 for a frame that includes a last byte 342 of a packet that is not aligned with the last byte of the frame) accommodates for this misalignment. Output of the third stage may be XORed with the CRC value for the last frame to produce the final CRC value for the entire mutli-frame packet. If packet data of the last frame is aligned with the last byte of the last frame, then the third stage is not utilized (e.g., as shown in FIG. 6) and the output of the second stage after accumulation of the CRC value calculated for the final frame into the running CRC value is used as the CRC value for the multi-frame packet.

Each of the stages uses a "zero-wheeling" block which converts a particular CRC value into a "zero-wheeled" version of that value. As used herein, the term "zero-wheeled" means that for any particular input CRC value, generated from an input data value, that input CRC value is modified to produce the value that would result if a specified number of zeroes were concatenated to the end (least-significant bits) of the input data value and then a CRC value were calculated for that concatenated value. For example, zero-wheel(16){CRC{I}} takes the value CRC{I} (i.e., the CRC value calculated for data value I) and converts CRC{I} to CRC{I, (16 zeroes)}, where "I, (16 zeroes)" represents the bits of I followed by 16 zeroes (i.e., in the least-significant-bits position). The zero-wheeling block allows for calculation of CRC values in different portions of a frame, followed by accumulation of the calculated CRC value portions using XOR gates, for example. The above described approach improves CRC calculation speed by allowing many different portions of the CRC value to be calculated in parallel. The CRC value portions are combined through XOR and zero-wheel operations, as described herein. Thus, the speed with which calculation of the CRC value can be completed is based on the speed with which the CRC value of a single portion can be calculated, since the portions of the CRC values are calculated in parallel. Details regarding the specifics of these operations are provided below, for example with respect to FIG. 4.

For the block diagrams and operations disclosed herein, any of the operations and blocks can be implemented in hardware, software, or combinations thereof. Known components such as XOR gates can be implemented in known ways. Other components can be implemented as a series of logic gates arranged according to the teachings provided herein. Any component or operation can be performed by software appropriately configured.

Figure 1:
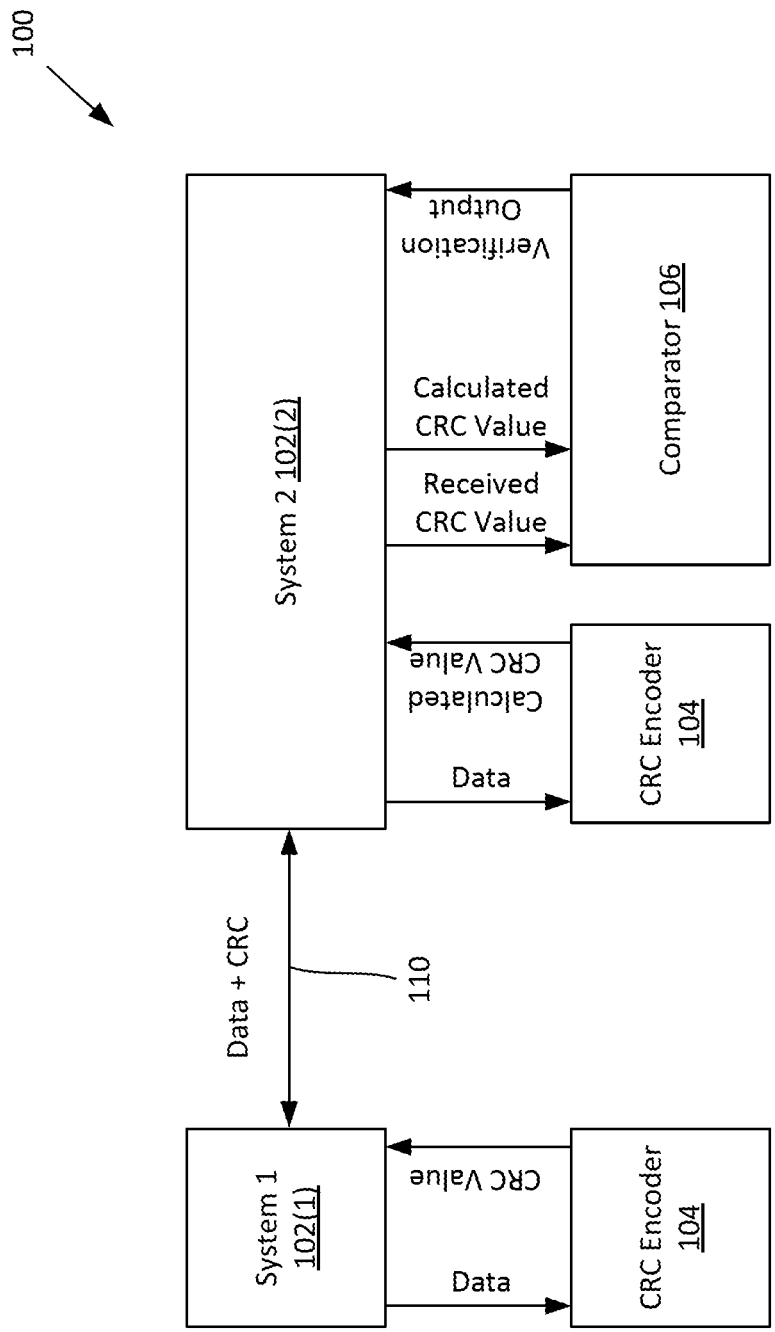
FIG. 1 illustrates a system for transmitting and verifying data using cyclic redundancy check ("CRC") encoding, according to an example.

FIG. 1 illustrates a communication system 100 for transmitting and verifying data using CRC encoding, according to an example. As shown, FIG. 1 includes system 1 102(1) and system 2 102(2), each of which may be any of a wide variety of data processing devices. System 1 102(1) communicates with system 2 102(2) via a communication line 110 (which can be a bus, for example). Examples of data processing devices that could be included within the systems 102 include a device including a memory and microprocessor circuit configured to execute instructions stored in the memory to perform the functionality described herein, a device including an application specific integrated circuit configured to perform functionality described herein, a field-programmable gate array (or other circuit with configurable circuit elements) configured to perform the functionality described herein, or any other technically feasible device configured to perform the functionality described herein. The communication line 110 may be any line technically feasible and capable of carrying data between the two systems 102, such as an Ethernet compatible transmission line or others that are technically feasible.

Data transmission with CRC functionality is performed as follows. System 1 102(1) identifies data to be transmitted to system 2 102(1). System 1 102(1) provides this data to a CRC encoder 104, which calculates a CRC value based on the data to be transmitted. System 1 102(1) obtains the CRC value and transmits both the data and the CRC value to system 2 102(2). Note that the CRC value that is transmitted by system 1 102(1) can be rearranged while being sent. Rearrangement of the CRC value means that the bytes of the CRC value can be re-ordered.

System 2 102(2) verifies the integrity of the received data by providing the received data to a CRC encoder 104. The CRC encoder 104 calculates a CRC value and provides that value to system 2 102(2). System 2 102(2) provides the calculated CRC value and the CRC value received from system 1 102(1) to the comparator 106. The comparator 106 compares these two CRC values and provides a verification output to system 2 102(2) based on the comparison. If the CRC values are equal, then the verification output indicates that the data received from system 1 102(1) is considered to be verified and if the CRC values are not equal, then the data from system 1 102(1) is considered to be corrupted.

Alternatively, instead of using of a comparator block 106, the CRC encoder 104 can be initialized with values corresponding to the received CRC value and then that initialized CRC encoder 104 can be used to calculate a new CRC value by inputting the received data. A CRC result value of all zeroes (or some other fixed, pre-set value) indicates that the received data is uncorrupted and any other result indicates that errors are present in the received data or such data has been corrupted. Alternatively, the CRC encoder 104 at system 2 102(2) can calculate a CRC value for the entire data plus CRC message that is received. A CRC result of all zeroes or some other pre-set value indicates that the CRC is correct and a CRC result of any other value indicates that the CRC is not correct.

If the CRC value was rearranged while being sent, then the result when the CRC encoder 104 is initialized with the received value will not be all zeroes but instead will be some fixed number dependent on the manner in which the bytes of the CRC value was rearranged. Because there is a limited number of ways in which the bytes of the CRC value can be rearranged, there is a limited number of possible fixed numbers that represent that the CRC value received is "valid." Thus, the CRC encoder 104 can search for each of these values; if any of these values is found, then the CRC encoder 104 deems the data to be valid and not corrupted; if none of these values are found, then the CRC encoder 104 deems the data to be corrupted. Calculating a CRC value based on input value is done via a process similar to polynomial division in which subtraction is replaced with XOR operations. The data for which the CRC value is to be calculated is divided by a "generator polynomial." The remainder of the polynomial division is considered to be the CRC value. Such CRC value calculation can be thought of as being performed by a shift register with XOR gates at positions indicated by the generator polynomial, as described in greater detail below with reference to FIG. 2.

Figure 2:
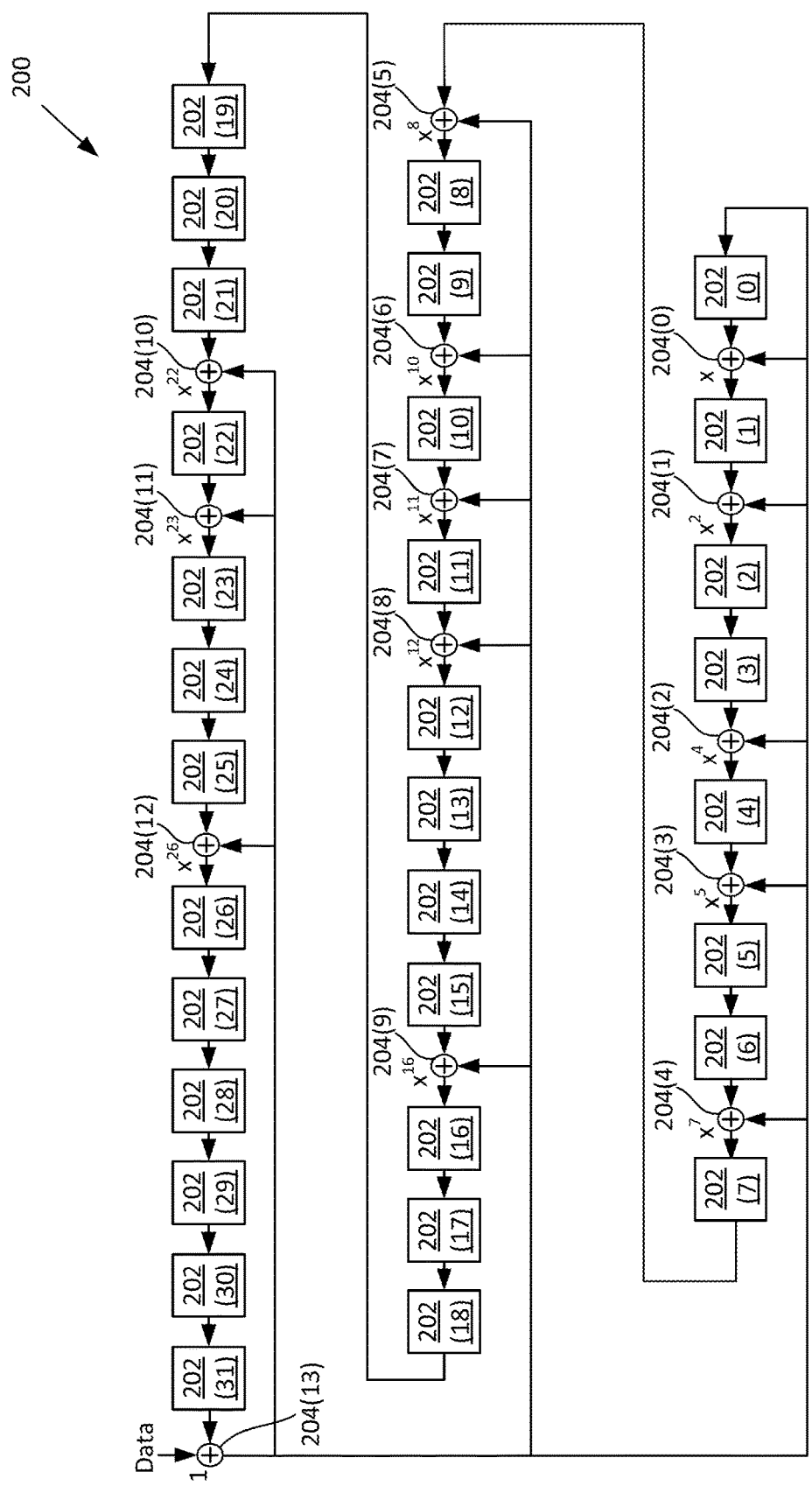
FIG. 2 is an illustration of a shift-register-with-XOR-gate implementation of a CRC encoder, according to an example.

FIG. 2 is a functional block diagram of a shift-register-with-XOR-gate implementation of a CRC encoder 200, according to an example, in which a sequential or series input is supplied to the encoder 20. The CRC encoder 200 of FIG. 2 includes storage elements 202 (where reference number 202 can refer individually or collectively to one or more storage elements of storage elements 202(0) through 202(31)), each of which can store one bit, and XOR gates 204 (where reference number 204 can refer individually or collectively to one or more of XOR gate 204(0) through XOR gate 204(13)), represented by a circle with a plus symbol. In operation, each of the storage elements 202 is initialized to a particular value (such as all zeroes or all ones, for example). Then, during each clock cycle, values are propagated from storage elements 202 to other storage elements 202, either directly and unmodified where an XOR gate 204 does not exist between two storage elements 202, or as processed by an XOR gate 204. Additionally, during each clock cycle a new bit of data is input to XOR gate 204(13).

Direct propagate from one storage element to another involves copying the bit value stored in a first storage element 202 to a second storage element 202 wherever only an arrow connects the first storage element 202 to the second storage element 202. Each storage element 202 for which an XOR gate 204 provides input receives the value output by that XOR gate 204. In the example configuration illustrated in FIG. 2, each XOR gate 204, except for the XOR gate that accepts the "data" input bit, which is XOR gate 204(13), receives as input, the output from XOR gate 204(13) and the output of a storage element 202, performs an XOR operation on those two input values, and outputs the result to a different storage element 202. For example, storage element 202(26) receives the value of ((input data bit)XOR(bit 31))XOR bit 25, where "input data bit" refers to the next bit serially input at the "Data" label, "bit 31" refers to the bit stored in storage element 202(31), and "bit 25" refers to the bit stored in storage element 202(25). Bits of input data are sequentially input at the point labeled "data" and the CRC result is the result in the storage elements 202 after all data for which a CRC result is desired has been input. In other words, the "final" CRC value, which is the result of inputting a sequence of input bits at the point indicated by the "Data" label, is the group of bits stored in the storage elements 202. These bits could be read out of the storage elements 202 in parallel or in any technically feasible manner.

The CRC encoder 200 shown in FIG. 2 is configured to divide the input data by a specific generator polynomial:
$x^{32}+x^{26}+x^{23}+x^{22}+x^{16}+x^{12}+x^{11}+x^{10}+x^8+x^7+x^5+x^4+x^2+x+1$ This polynomial is the polynomial for the well-known CRC-32 standard. The various exponents of x in the above polynomial correspond with the positions of the XOR gates 204 in the CRC encoder 200 of FIG. 2 (these exponents are illustrated in FIG. 2 over corresponding XOR gates 204. Other generator polynomials could be used for CRC, with corresponding changes to the CRC encoder 200.

Figure 3:
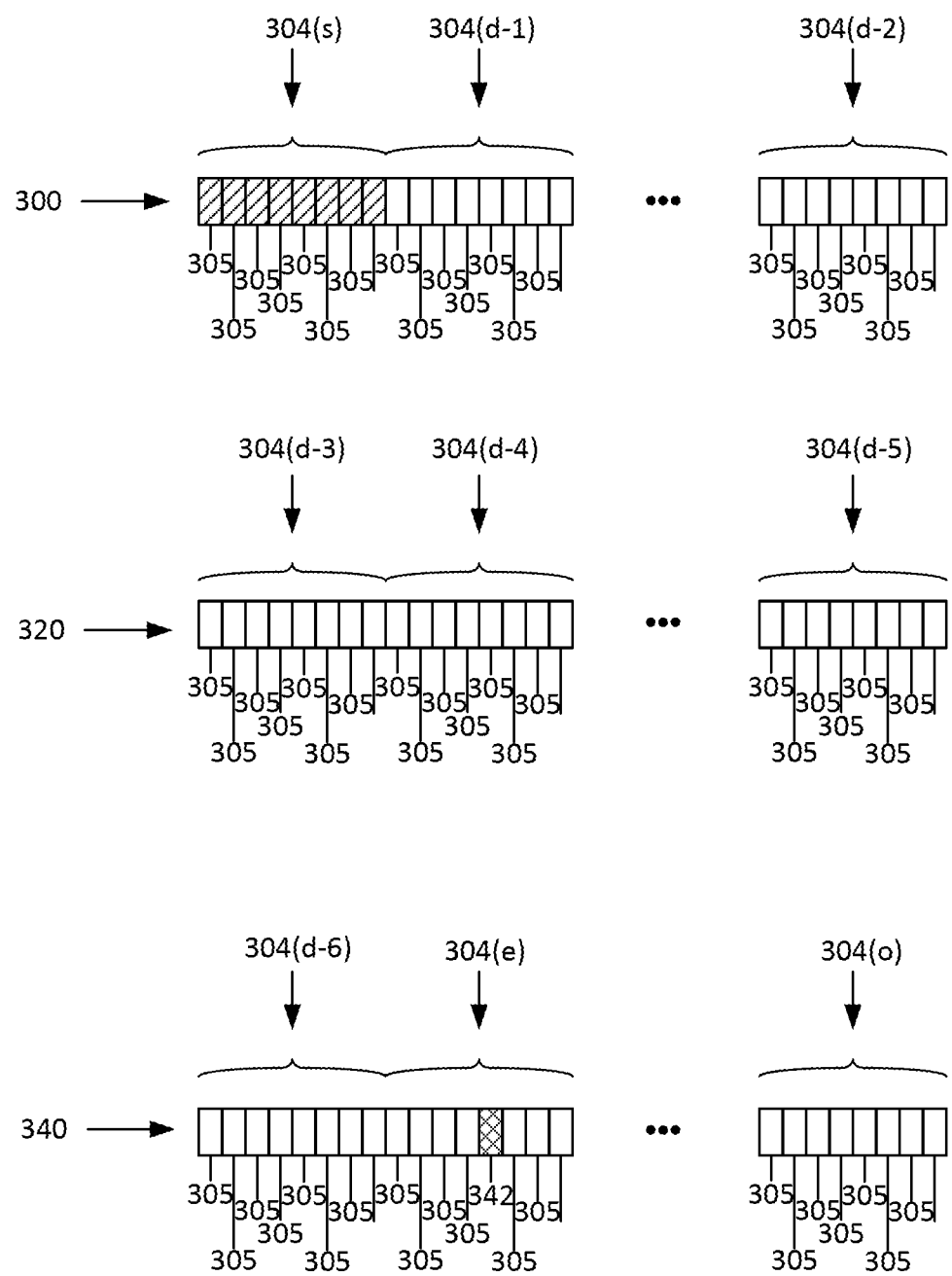
FIG. 3 illustrates aspects of three Ethernet frames, according to examples.

One use for CRC is to provide the ability to verify the integrity of Ethernet packets. FIG. 3 illustrates aspects of three Ethernet frames, according to examples. The different Ethernet frames illustrate the manner in which data for an Ethernet packet can be distributed throughout multiple consecutive Ethernet frames. This distribution is a way of sending a single packet over multiple frames, such that each frame and an associated portion of the packet is received during a particular clock cycle. Each of the first Ethernet frame 300, the second Ethernet frame 320, and the third Ethernet frame 340 includes a series of bytes 305 organized into chunks 304. Each chunk 304 (where reference character 304 refers collectively or individually to one or more of starting chunk 304(s), any of data chunks 304(d-1) through 304(d-6), ending chunk 304(e), and external chunk 304(o), as well as other chunks not shown) includes 8 bytes 305 and is thus 64 bits long. The number of bytes 305 shown and described is illustrative and can be modified as desired. (e.g., chunks 304 can be 128 bits long, 32 bits long, or any other number of bits long). Each of the frames (300, 320, 340) has the same frame width—equal to the number of chunks 304 in the frame (300, 320, 34) multiplied by the size of a chunk 304.

The first Ethernet frame 300 is a frame that contains the chunk 304 for the start of a packet (i.e., the starting chunk 304(s)). This starting chunk 304(s) includes an Ethernet packet preamble and a start-of-packet (SOP) indicator (not shown). The payload data for the Ethernet packet started by first Ethernet frame 300 starts in the first data chunk 304 (d-1), which is the chunk 304 immediately after the starting chunk 304(s). Chunks 304 that contain payload data for the packet are referred to as data chunks 304(d) herein. The packet at issue starts after the starting chunk 304(s) and continues past the end of the frame 300 to other frames.

The second Ethernet frame 320 is an intermediate frame. That is, the second Ethernet frame 320 contains data chunks 304(d) (where reference number 304(d) refers individually or collectively to one or more data chunks, such as data chunks 304(d-3), 304(d-4), 304(d-5), or other data chunks not shown), but no starting chunks 304(s) or end-of-packet bytes 342. Any number of intermediate frames 320 can be included in a multi-frame packet (with limitations based on the maximum size of an Ethernet packet). The third Ethernet frame 340 is an ending frame and includes zero or more data frames (such as data frame 304(d-6)) and an end chunk 304(e) that includes an end-of-packet byte 342. This end-of-packet byte 342 is the last byte in the multi-frame packet. An external data chunk 304(o) is illustrated after the end chunk 304(e). This external data chunk 304(o) is part of the ending frame 340, but is not part of the packet started in the first frame 300 and continued through the intermediate frame(s) 320 to the ending frame 340.

CRC calculation for an Ethernet packet involves calculating a CRC value for all of the bytes that have data associated with that packet. Thus, using the example multi-frame packet of FIG. 3, a CRC value for a packet spanning a starting Ethernet frame 300, at least one intermediate Ethernet frame 320, and an ending Ethernet frame 340, would be calculated by calculating a single CRC value for all of the data found in the data chunks 304(d) as well as the bytes 305 up to and including the last-in-packet byte 342 of the ending chunk 304(e).

There can be a large amount of such data (for example, high bitrate Ethernet could have at least 1024 data bits per frame, with many frames that may be used to carry the data of a single packet), and because the data is received over multiple clock cycles. Accordingly, conventional CRC calculations may be complicated and require an excessive amount of time. FIGS. 4-7 illustrate techniques for calculating a CRC value for a multi-frame Ethernet packet consistent with the present disclosure.

Figure 4:
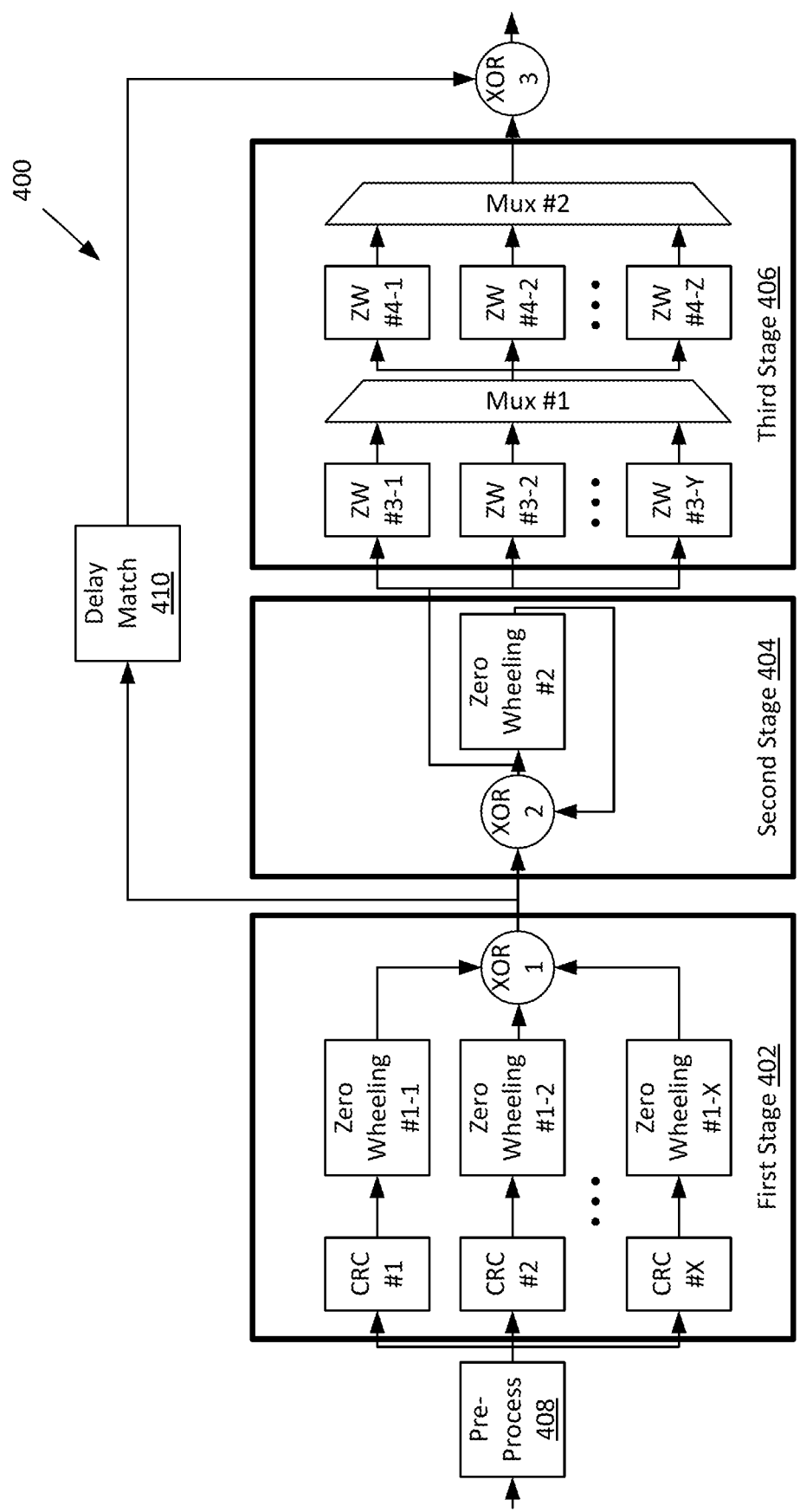
FIG. 4 is a block diagram of a CRC calculation circuit, according to an example.

FIG. 4 is a block diagram of a CRC calculation circuit 400, according to an example. As shown, the CRC calculation circuit 400 includes a first stage 402 for calculating a CRC value of a single frame of data in a parallel manner, a second stage 404 for calculating a CRC value for multiple frames of data, and a third stage 406 for calculating a CRC value for a final frame of data.

The following mathematical principles underlie operation of the CRC calculation circuit 400.

The CRC value of any number (such as the data packet that spans multiple frames) can be expressed as CRC values for portions of that number XORed together. In one example, a message M may be split into sub-messages {S1, S2, S3} (this notation indicates bitwise concatenation of the sub-messages, with S1 having the most significant bits and S3 having the least significant bits). The message M can be expressed as: {S1, 0, 0} XOR {0, S2, 0} XOR {0, 0, XOR}. Each of the 0's represents a sequence of 0-value bits having a number of bits equal to the number of bits in the sub-messages S1, S2, and S3.

The CRC value of {S1, S2, S3} can be expressed as CRC {S1, 0, 0} XOR CRC {0, S2, 0} XOR CRC {0, 0, S3}, which is equivalent to CRC{S1, 0, 0} XOR CRC{S2, 0} XOR CRC{S3} because a string of 0's in the most significant bits of a message to which CRC is applied does not affect the resultant CRC output. The above CRC expression still requires calculation of CRC of a large sequence of bits (e.g., CRC{S1, 0, 0}). To reduce the size of the input to the CRC (and thus reduce the time required for calculating the CRC value), the CRC expression above is modified to: Zero-Wheel(2B)(CRC{S1}) XOR Zero-Wheel(B) (CRC{S2, 0}) XOR Zero-Wheel(0) (CRC{S3}), where B is the number of bits in the "0" symbol that indicates that any of S1, S2, or S3 are replaced by a sequence of zeroes as described above. In other words, B is the number of zeroes represented by the "0" symbol in expressions such as {S1, 0, 0}, {0, S2, 0}, or {0, 0, S3} used above.

The "zero-wheel(N){CRC{I}}" function has the function of modifying the CRC value shown as input to the zero-wheel function (e.g., CRC{I}) as if that CRC value were stored in the storage elements 202 of the shift-register CRC circuit representation of FIG. 2 and then a number of 0's equal to the number indicated are applied sequentially to the "data" input. In other words, Zero-wheel(N){CRC{X}} converts CRC{X} to CRC{X,{N 0's}}. The above principles are reflected in various facets of operation of the CRC circuit 400 as now described.

As shown, the CRC circuit 400 includes a first stage 402, a second stage 404, and a third stage 406, all connected in series. A pre-process block 408 before the first stage 402, a delay match block 410 as shown, and a final XOR 412 after the third stage 406 are shown.

The stages of the CRC circuit 400 each work primarily on data for a single Ethernet frame of a multi-frame packet. This data is combined via several mechanisms to obtain a single CRC value for the entire Ethernet packet. Calculation of the CRC value is done in accordance with the following principles.

Data of an Ethernet packet for which CRC is to be calculated, referred to as "P," can be expressed as a combination of data values over multiple Ethernet frames. A first data portion, which can begin at any chunk of the first frame of the packet (first frame 300 in FIG. 3), contains a number of bits of data that contribute to the CRC value of the packet, where that number can have a value between the number of bits in a single chunk 304 and the number S, where S is the maximum number of data bits that can be in a frame (a "frame width"). Subsequent intermediate frames (second frame 320 in FIG. 3), include S bits of data that contribute to the CRC value. An ending frame (third frame 340 in FIG. 3) contains E bits of data, where E is any value up to S bits and represents the number of bits in the last frame 340 up to and including the end byte 342. The entire packet can be represented as:

$P=\{F, I_1, \ldots, I_N, L\}$

In the above expression, "F" is the data bits in the first frame in the packet, $I_1$ through $I_N$ is the data for each intermediate frame in the packet, and L is the data for the last frame in the packet. The CRC of this packet can be expressed as:

TABLE 1

Composite expression for multi-frame packet

CRC $\{F, I_1, \ldots, I_N, L\}$, which equals:
CRC{F, S x N zeroes, E zeroes} XOR
CRC $\{I_1$, S x (N−1) zeroes, E zeroes$\}$ XOR
... XOR
CRC$\{I_{N-1}$, S zeroes, E zeroes$\}$ XOR
CRC $\{I_N$, E zeroes$\}$ XOR
CRC $\{L\}$,
where the ellipsis " . . . " represents CRC's corresponding to the intermediate packets.

Using the zero-wheeling function described above, this CRC can modified to be expressed as:

TABLE 2

Composite expression with zero-wheel for multi-frame packet

Zero-wheel(SxN + E){CRC{F}} XOR
Zero-wheel(Sx(N−1) + E){CRC $\{I_1\}$} XOR
... XOR
Zero-wheel(S+E){CRC$\{I_{N-1}\}$} XOR
Zero-wheel(E){CRC $\{I_N\}$} XOR
Zero-wheel(0){CRC{L}}

The above expression can be further modified in order to allow for implementation where the "E" value appears in only one zero-wheel operation, to allow for efficient hardware implementation with iterative zero-wheeling by the same value (S), as follows:

TABLE 3

Composite expression for multi-frame packet with zero-wheeling and separate zero-wheeling for bits of last frame CRC $\{F, I_1, \ldots, I_N, L\}$ =
Zero-wheel(E){CRC $\{F, I_1, \ldots, I_N\}$} XOR CRC{L} =
Zero-wheel(E) {
Zero-wheel(SxN){CRC{F}} XOR
Zero-wheel(Sx(N−1)){CRC $\{I_1\}$} XOR
. . . XOR
Zero-wheel(S){CRC$\{I_{N-1}\}$} XOR
Zero-wheel(0){CRC $\{I_N\}$}
}
XOR
Zero-wheel(0){CRC{L}}

Finally, to allow for iterative zero-wheeling by the value S, the above expression can be modified as follows. The second stage 404 iteratively calculates a "running" CRC value to build up the CRC value up to the last intermediate frame. The zero-wheel by multiples of S function can be "stacked" or "repeated," thus allowing the following modification to the expressions in Table 3:

TABLE 4

Stacked zero-wheel expression for CRC calculation

Zero-wheel(E) {
Zero-wheel(S){
CRC{F} XOR
Zero-wheel(S){
CRC$\{I_1\}$ XOR
Zero-wheel(S){
CRC$\{I_2\}$ XOR
Zero-wheel(S){
CRC$\{I_3\}$ XOR
. . .
XOR TABLE 4-continued Stacked zero-wheel expression for CRC calculation Zero-wheel(S){
CRC$\{I_{N-2}\}$ XOR
Zero-wheel(S) {
CRC$\{I_{N-1}\}$ XOR
Zero-wheel(0) {CRC$\{I_N\}$}
}}} . . . }}}
XOR
Zero-wheel(0){CRC{L}}

The different stages of the circuit 400 implement different portions of the expressions of Table 4. The first stage 402 works according to the following principles:

TABLE 5

Expression for determining CRC for individual frame

CRC for a particular frame I =
CRC{$C_1$, S − 1R zeroes} XOR
CRC {$C_2$, S−2R zeroes} XOR
CRC{$C_3$, S−3R zeroes} XOR . . . XOR
CRC{$C_{S/R}$} which can be further expressed as:

TABLE 6

Expression for calculating CRC for individual frame, with zero-wheeling

Zero-wheel(S−1R){CRC{$C_1$}} XOR
Zero-wheel(S−2R){CRC{$C_2$}} XOR ... XOR
Zero-wheel(0){CRC{$C_{S/R}$}}
where $C_A$ is the data in chunk A;
S is the number of bits in a frame; and
R is the number of bits in a chunk.

The first stage 402 determines the CRC value for a single frame according to the expressions of Table 6. Within the first stage 402, each CRC block from CRC 1 to CRC X calculates a CRC value for a different chunk 304 of the frame input to the first stage 402. The zero-wheeling blocks 1-1 through 1-X zero wheel respective CRC values by a respective number of zeroes. The number of zeroes by which a particular zero-wheel block acts on a particular CRC value is dependent on the position of the chunk within the frame. The CRC value for the chunk corresponding to the most significant bits of the frame is zero-wheeled by S-R bits (where S is the frame size and R is the chunk size). The CRC value for the next chunk is zero-wheeled by S-2R bits. The CRC value for the next chunk is zero-wheeled by S-3R bits, and so-on, up to the last chunk which is zero-wheeled by zero bits (meaning that no modification to that CRC value occurs). All zero-wheeled CRC values are XORed together at XOR block 1 and the result is output as shown to the second stage 404 and to the delay match block 410. This result is the CRC for the frame that is currently being processed by the first stage 402. (Data for one frame is processed per cycle in each of the first stage 402, the second stage 404, and the third stage 406).

For starting frames, any chunk 304 of the frame that is not a part of the packet (for example, chunk 304(s) that includes starting data and chunks prior to chunk 304(s), which includes data from one or more prior packets) are replaced with 0's. For example, for a frame size of 1024 bits of data split into 16 chunks and for a first frame having 8 chunks of data, the first stage 402 calculates CRC{512 zeroes, F}, where F is the data in the first frame of data and where the first 8 chunks, having 512 bits, are replaced with zeroes. For intermediate frames, the first stage 402 calculates the CRC for all data in that frame. For example, for a first intermediate frame having data $I_1$, the first stage 402 calculates CRC{$I_1$}. For a final frame, the first stage 402 calculates the CRC value for the data in that final frame. The data for the final frame is "downshifted," and all most significant bits are replaced with zeroes. For the first frame and the final frame, the pre-process block 408 aligns the input data and concatenates zeroes appropriately.

The first stage 402 calculates CRC for each frame in the multi-frame packet. Thus, the first stage 402 calculates the following CRC values: CRC{F}, CRC {$I_1$}, . . . CRC{$I_{N-1}$}, CRC{$I_N$}, CRC{L}. The second stage 404 calculates a "running" CRC value for each frame being received by the CRC circuit 400, implementing the following expression (reproduced from a portion of Table 4).

TABLE 7

Expression for running CRC value

Zero-wheel(S){
CRC{F} XOR
Zero-wheel(S){
CRC{$I_1$} XOR
Zero-wheel(S){
CRC{$I_2$} XOR
Zero-wheel(S){
CRC{$I_3$} XOR
...
XOR
Zero-wheel(S){
CRC{$I_{N-2}$} XOR
Zero-wheel(S) {
CRC{$I_{N-1}$} XOR
Zero-wheel(0) {CRC{$I_N$}}
}}}...}}}

The second stage 404 implements all but the Zero-wheel (E) portion of the expressions from Table 4. More specifically, the second stage 404 accepts as input the most recently calculated CRC value from the first stage 402 (i.e., the CRC value for the previous frame) and XOR's that CRC value with the previous "running" CRC value zero-wheeled by S zeroes (by zero-wheel block #2). Thus, the second stage builds up a running CRC value as illustrated in the expressions of Table 7.

By way of illustration, in a first cycle, CRC{F} is received as input to XOR gate 2 from the first stage 402. In a second cycle, CRC{$I_1$} is received as input to XOR gate 2 from first stage 402 and is XORed with zero-wheel(S){CRC{F}}. In a third cycle, CRC{$I_2$} is received as input to XOR gate 2 from the first stage 402 and is XORed with zero-wheel(S) {CRC{$I_1$} XOR zero-wheel(S){CRC{F}}}. The second stage 404 continues building up a running CRC value in this manner until the CRC value is calculated for the last frame by the first stage 402. At this point, that CRC value is output to the delay match block 410 and the running CRC value is output to the third stage 406, which applies zero-wheel(E) to the running CRC value.

Operation of the third stage 406 will next be described. First, the running CRC value from the second stage 404 is output to each zero-wheel block ZW 3-1 through ZW 3-Y. Each of these zero-wheel blocks is configured to zero-wheel by a different multiple of the number of bits in a chunk 304. A first multiplexor ("MUX #1") selects the zero-wheel block that corresponds to the number E (the number of bits up to and including the last byte of the packet in the final frame), but rounded down to the nearest chunk-size multiple. More specifically, the zero-wheel block that is selected is the zero-wheel block that zero-wheels the running CRC value by E divided by chunk size, with the remainder dropped, multiplied by the chunk size. Thus if the value E is 580 and the chunk size is 64, then the zero-wheel block that is selected (ZW 3-10, not illustrated in FIG. 4) is the one that zero-wheels by 576 (580/64 is 9.0625; 9.0625 rounded down is 9; 9 multiplied by 64 is 576). This output is provided to another set of zero-wheel blocks ZW4-1 through ZW4-Z. Each of these zero-wheel blocks zero-wheels by a different multiple of 8, from 0 through the size of the chunk minus 8. The second multiplexor (MUX #2) selects the output from the zero-wheel block that corresponds to the remainder of E divided by the chunk size. For the above example (580/64), the remainder is 8, and so ZW #4-2 (which zero-wheels by 8 bits) is selected.

The output of the third stage 406, corresponds to.

TABLE 8

Expressions for output of third stage 406

Zero-wheel(E) {
Zero-wheel(SxN){CRC{F}} XOR
Zero-wheel(Sx(N−1)){CRC {I$_1$}} XOR
... XOR
Zero-wheel(S){CRC{I$_{N−1}$}} XOR
Zero-wheel(0){CRC {I$_N$}}
}

The third XOR (XOR 3) XORs the value output by the third stage with the output of the delay match block 410 (which delays by one cycle to arrive at XOR gate 3 at the same time as the corresponding output from the third stage 406) to arrive at the final CRC value. This final CRC value is the CRC value for the entire Ethernet packet and corresponds to the following expression:

TABLE 9

Expression for CRC of entire multi-frame packet, output by XOR 3

Zero-wheel(E) {
Zero-wheel(S){
CRC{F} XOR
Zero-wheel(S){
CRC{I$_1$} XOR
Zero-wheel(S){
CRC{I$_2$} XOR
Zero-wheel(S){
CRC{I$_3$} XOR
...
XOR
Zero-wheel(S){
CRC{I$_{N−2}$} XOR
Zero-wheel(S) {
CRC{I$_{N−1}$} XOR
Zero-wheel(0) {CRC{I$_N$}}
}}}...}}}
XOR
Zero-wheel(0){CRC{L}}

The operations of the CRC circuit 400 are dependent on the number of frames in a multi-frame packet. If no intermediate frames are present, then the CRC circuit 400 calculates only the CRC values for the first and last frame. The CRC circuit 400 zero-wheels the CRC value for the first frame by the number of bits outside of the packet in the last frame at stage 3 and XORs that value with the CRC for the final frame at XOR 3. CRC for a packet having only a single frame is calculated by calculating the CRC for first frame at the first stage 402. The CRC value effectively passes through the second stage 404 (because the CRC value is XORed with zero) and is then zero-wheeled by the number of bits to the right of the last byte of the frame by the third stage. The result of this zero-wheel operation is output from the third stage 406 and is XORed with zero at XOR 3 to produce the final CRC result.

Generation of a zero-wheel block will next be described. The zero-wheel function can be obtained, as a boolean algebra expression (that can be converted to hardware, software, or a combination thereof) for any generator polynomial, any number of 0's, and any size CRC output using a symbol analysis technique. More specifically, each bit corresponding to a storage element 202 of the shift-register CRC circuit representation of FIG. 2 is assigned a symbol. Then, for each 0 in "N" of the zero-wheel function, the operations (i.e., XOR and shift-assignment) of the shift-register CRC circuit are applied to each of these symbols, with a "data" input of 0, to obtain new expressions for the corresponding storage element 202. This operation repeats for all zeros indicated for the specific zero-wheel function (e.g., "N") above. The expression obtained can be periodically (e.g., after every new zero is input) simplified by canceling out duplicate terms. This is possible since anything XORed with itself is 0 and 0 XORed with any value outputs that value. This technique can be implemented in software to output an expression that indicates the manner in which an appropriate zero-wheel block is to be constructed.

An example of this technique being applied is shown below, but for a very simple example CRC operation having only 4 output bits. The polynomial for the example CRC is $x^4+x^2+x+1$. This CRC has four storage elements 202, S3, S2, S1, and S0. Because of the polynomial, the "assignment function" (which represents the value to be assigned to each storage element) is as follows: S0←S3 (the "1" term of the generator polynomial does not affect the value assigned to S0, as a 0 is the input data, and a value XORed by 0 is the same value) S1←S0 ^S3 (the XOR in this expression is due to the presence of the "x" term) S2←S1 ^S3 (the XOR in this expression is due to the presence of the "$x^2$" term) S3←S2 (there is no XOR operation because the generator polynomial does not contain an "$x^3$" term)

In other words, after each cycle: the value in the S3 storage element is assigned to the S0 storage element; the value in the S0 storage element XOR'ed with the value in the S3 storage element is assigned to the S1 storage element; the value in the S1 storage element XOR'ed with the value in the S3 storage element is assigned to the S2 storage element; and the value in the S2 storage element is assigned to the S3 storage element.

Assume original values in each storage element as follows: S3o, S2o, S1o, and S0o represent the original values stored in storage elements S3, S2, S1, and S0, respectively. Additionally, assume that N 0's are input to the shift register representation of the CRC circuit, one 0 at a time. Then, the values in the storage elements evolve as follows. After a single 0 is input to the CRC circuit:

TABLE 10

Example assignment expressions

S0 <-- S3o
S1 <-- S0o ^ S3o
S2 <-- S1o ^ S3o
S3 <-- S2o

After a second cycle of 0 input (i.e., after 0's), each storage element would store values represented as follows:

TABLE 11

Example evolution of input according to assignment expressions

S0 <-- S2o
S1 <-- S3o ^ S2o
S2 <-- S0o ^ S2o ^ S3o
S3 <-- S1o ^ S3o
    After the next 0 (3 0's):
S0 <-- S1o ^ S3o
S1 <-- S1o ^ S2o ^ S3o
S2 <-- S1o ^ S2o ^ S3o ^ S3o = S1o ^ S2o
S3 <-- S0o ^ S2o ^ S3o TABLE 11-continued Example evolution of input according to assignment expressions After the next 0 (4 0's):
S0 <-- S0o ^ S2o ^ S3o
S1 <-- S1o ^ S3o ^ S0o ^ S2o ^ S3o = S0o ^ S1o ^ S2o
S2 <-- S1o ^ S2o ^ S3o ^ S0o ^ S2o ^ S3o = S0o ^ S1o
S3 <-- S1o ^ S2o This sequence of assignment per the assignment equations can be repeated any number of times to obtain expressions for each bit of the result of the zero-wheel function for the number of 0's specified. Each expression obtained for each bit can be converted to a circuit or to software simply by replicating the specific sequence of XOR operations indicated in each of the expressions by actual logic gates or by software operations. For example, for Zero-wheel(4) of a 4-bit CRC value, with the above generator polynomial, the resulting value for the fourth bit, "S3" can be obtained by XORing the original $2^{nd}$ bit ("S1o") of the input CRC value with the original $3^{rd}$ bit ("S2o") of the input CRC value. The above explains how to generate a circuit or software to perform the "zero-wheel" function disclosed herein. The same technique can be used to generate a circuit or software to perform the zero-wheel function for any number of zero-wheel zeroes and for any particular generator polynomial and CRC bit-length. It should be understood that the CRC function (that is, the generator polynomial and the number of storage elements/output bits) used for every zero-wheel function in the CRC circuit 400 is preferably the same as each other and is preferably the same as the CRC function used in each of the CRC blocks of the first stage 402.

Figure 5:
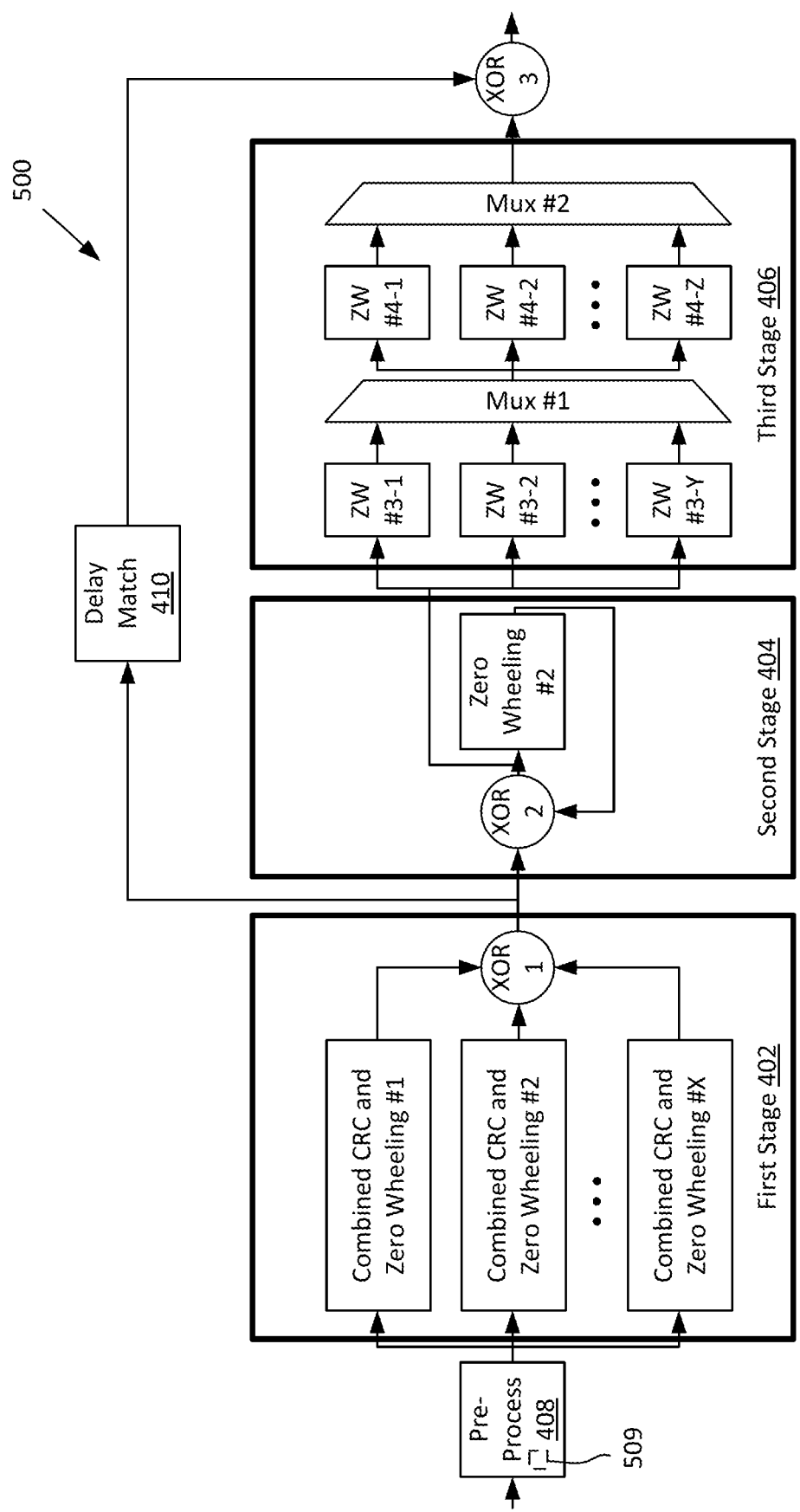
FIG. 5 is a block diagram of a CRC circuit according to another example.

FIG. 5 is a block diagram of a CRC circuit 500 according to another example. The CRC circuit 500 is identical to the CRC circuit 400 except that the CRC blocks in the first stage 402 and the Zero-wheeling blocks in the first stage 402 are replaced with combined CRC and zero-wheeling blocks. The combined CRC and zero-wheeling circuits implement the same function as the CRC blocks of the first stage 402 and the zero-wheeling blocks of the first stage 402, together, but do so in a more efficient manner by including fewer XOR gates or by performing fewer XOR operations.

The logic to implement the combined CRC and zero-wheeling blocks of the first stage 402 can be obtained by performing the symbol analysis technique described above with a few modifications. First, instead of starting the shift-register implementation of the CRC circuit with the output of the CRC blocks of the first stage 402, the combined CRC and zero-wheeling circuits are started with all zeroes. Then, the iterative symbol analysis described above is performed, but instead of using a specified number of zeroes as input, the following is used as input. The input is a respective chunk of the frame being processed (represented generically as a set of input bits, such as I[1023-960]) by the first stage 402, followed by a specified number of zeroes. For example, for a frame of size 1024 bits and having 64 bit chunks, the first combined CRC and zero-wheeling circuit (e.g., #1) would get bits 1023-960 of the frame, followed by 960 zeroes as input. (Thus the iterative operation to identify the specific logic to use for the first combined CRC and zero-wheeling block would take 1024 iterations). The second combined circuit (#2) would get bits 959-896 of the frame, followed by 896 zeroes. The third combined circuit would get bits 895-832 of the frame, followed by 832 zeroes, and so on, until the bottom block, which would receive the final 64 bits (bits 63-0) of the frame and would get 0 zeroes as input. The resulting logic for each combined block would be some combination of XOR operations on the input bits of the chunk assigned to that combined block. As an illustrative example that is not necessarily based on any generator polynomial, but is provided only to illustrate how the combined block is described, combined block #1 might be specified as S1023 XOR S1019 XOR S1015 XOR S1014 XOR S1013 XOR . . . XOR S970 XOR S962, which could be implemented in an appropriate series of logic gates or software operations. The number of logic gates or XOR operations necessary for any particular combined CRC and zero wheeling circuit is lower than that needed for the distinct CRC blocks and zero-wheeling blocks of FIG. 4.

FIG. 6 is a CRC circuit 600 according to another example. In the CRC circuit 600 of FIG. 6, the third stage 406 of the previous versions is removed and the pre-processing block 508 is modified with respect to the pre-processing block 408 in order to make the third stage 406 unnecessary.

As noted above, the CRC of an entire packet can be calculated as follows:

TABLE 12

Expressions corresponding to CRC circuit

Zero-wheel(E) {
Zero-wheel(SxN){CRC{F}} XOR
Zero-wheel(Sx(N-1)){CRC {I$_1$}} XOR
... XOR
Zero-wheel(S){CRC{I$_{N-1}$}} XOR
Zero-wheel(0){CRC {I$_N$}}
}
XOR
Zero-wheel(0){CRC{L}}

The "E" term refers to the zero-wheel operation performed by stage 3 406. The E term is used for a final frame 340, which can be characterized as a frame that has a last byte 342 that does not align with the end of that frame. Therefore, if all of the data can be shifted such that the last byte 342 occupies the last byte in the last frame, then there is no final frame 340 and the zero-wheeling(E) operation is unnecessary. Because the third stage 406 is the hardware that implements zero-wheeling(E), this hardware can be removed if data for the entire packet can be shifted over as described.

The above technique is used when the CRC encoder 104 has data indicating the length of the packet. To perform this shifting, the pre-process block 408 receives the length of the packet and has a buffer 509 that can store an entire packet. Once the entire packet is received, the pre-process block 408 rearranges the data to align the data with the last byte in the last frame 340. Specifically, the pre-process block 408 shifts bytes to the right in the last frame, up to the end of that frame and imports data from the immediately previous frame, in order, to fill in the space vacated by the shifted data. The pre-process block 408 shifts data and moves data from one frame to the other in the manner described so that all data is shifted down by a number of bytes sufficient to align the last byte of the packet with the last byte of the last frame. The pre-process block 508 then inputs that modified data into the CRC circuit 600 of FIG. 6 for CRC calculation.

Figure 7:
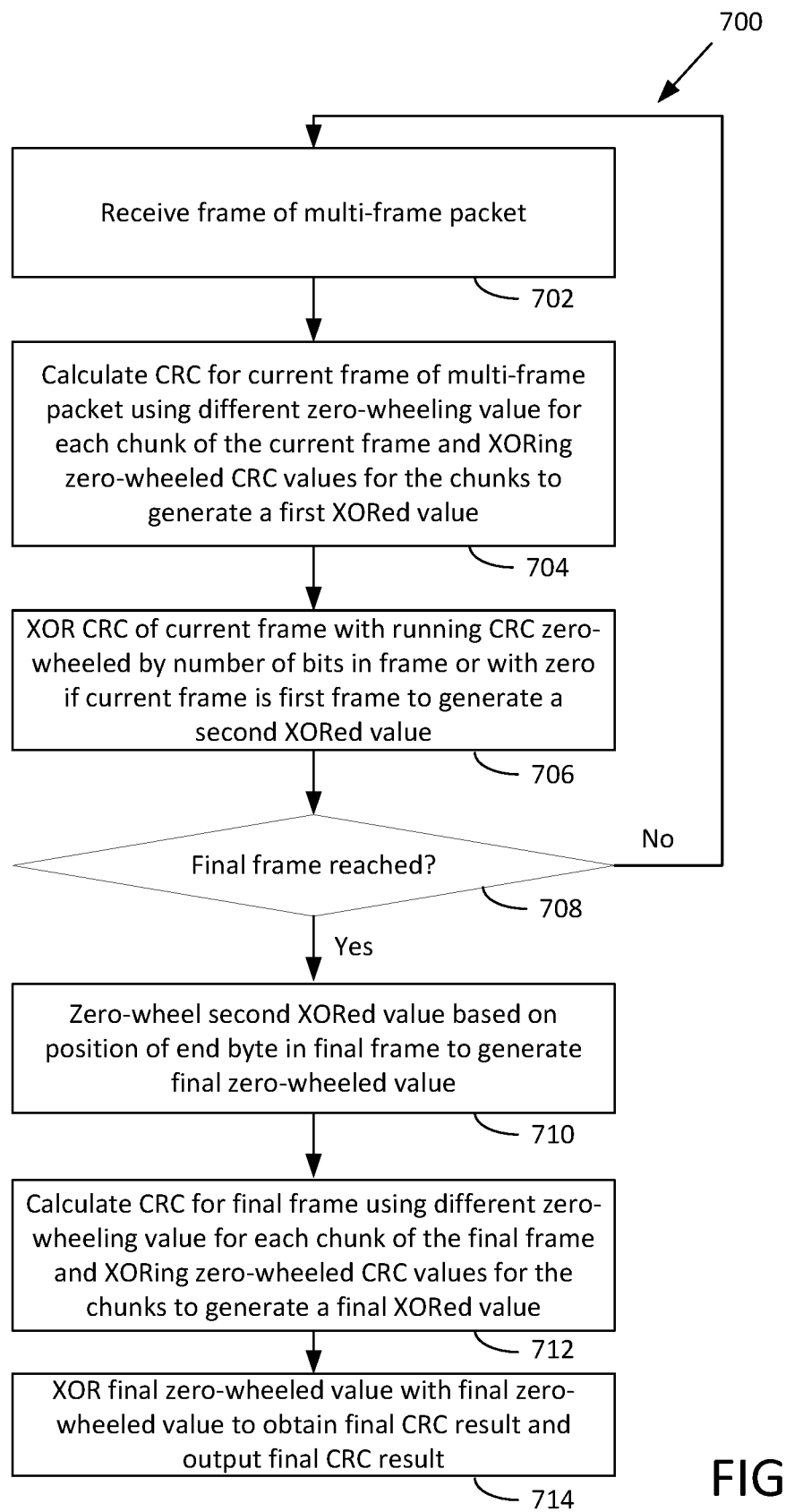
FIG. 7 is a flow diagram of a method for calculating a CRC value for a multi-frame Ethernet packet, according to an example.

FIG. 7 is a flow diagram of a method 700 for calculating a CRC value for a multi-frame Ethernet packet, according to an example. Although described with respect to the system shown and described in FIGS. 1-6, it should be understood that any system configured to perform the method, in any technically feasible order, falls within the scope of the present disclosure. For example, it should be understood that due to the pipelined nature of the CRC circuit 400, the CRC circuit 500, and the CRC circuit 600, distinct steps of method 700 may be performed during overlapping periods of time.

The method 700 begins at step 702, where a CRC circuit (either CRC circuit 400, CRC circuit 500, or CRC circuit 600) receives a frame of a multi-frame packet. At step 704, the first stage 402 calculates a CRC value for the received ("current") frame. As shown in FIGS. 4, 5, and 6, a different zero-wheeling value is used for each different chunk of the received frame. For example, a CRC value for the chunk representing the most significant bits of the frame is zero-wheeled by a number of zeroes equal to the size of the frame minus the chunk size. A CRC value for the chunk having the next-most significant bits is zero-wheeled by a number of zeroes equal to the size of the frame minus twice the chunk size. Each resultant zero-wheeled CRC value is XORed together to generate a first XORed value (by XOR 1 in the first stage 402). The first XORed value is the output of the first stage 402 and is also referred to as the "CRC value of the current frame."

At step 706, the second stage (specifically, "XOR 2"), XORs the CRC of the current frame with the running CRC value zero-wheeled by the number of bits in a frame. If the current frame was the first frame, then XOR 2 XORs the CRC of the current frame with 0. The running CRC value is the value output by XOR 2 in previous cycles. The value output by XOR 2 is referred to as the second XORed value. At step 708, the CRC circuit (CRC circuit 400, CRC circuit 500, or CRC circuit 600) determines whether the final frame has been reached. If a final frame has not been reached, then the method returns to step 702 and if a final frame has been reached, then the method proceeds to step 710. At step 710, the third stage 406 zero-wheels the second XORed value by a number of bits equal to the number of bits up to the last byte of the packet in the final frame ("E" above). This zero-wheeling is done via two "sets" of zero-wheel blocks. The first set zero-wheels the second XORed value by a number of zeroes that equals the number of bytes in the final frame rounded down to the nearest multiple of a chunk size. The second row zero-wheels the result of the first row by a number of bytes in the ending chunk 304(e) of the packet. For example, if the ending chunk 304(e) of the packet has 5 bytes that are inside the packet (with the latter bytes in the ending chunk 304(e) being outside of the packet), then the second row zero-wheels the result of the first row by 5 bytes. At step 712, the first stage 402 calculates the CRC value for the final frame in the same manner as with step 704. The output of the final frame is output, via the delay match block 410, to XOR 3, which XORs this output with the zero-wheeled result from step 712 at step 714. The output of XOR 3 is the final CRC of the multi-frame packet. For the CRC circuit 600, steps 710 through 714 are omitted—the output of the second stage 404 is used as the final CRC value of the multi-frame packet.

The above techniques allow for calculation of CRC values for very large Ethernet packets in a quick manner. Portions of CRC values are calculated each frame and are combined to arrive at a final CRC value for the frame. The CRC values for each frame are also combined to arrive at the final value for the packet. The use of the zero-wheeling function allows for each CRC value calculation to be a calculation of a limited set of data (e.g., one chunk of a frame), which allows such calculations to be completed quickly and in parallel, thereby allowing the CRC value for a single frame to be calculated in roughly the amount of time for calculating the CRC value for a chunk of that frame.

Additionally, the architecture illustrated in FIGS. 4, 5, and 6 allows for scalability without affecting delay across the CRC circuit. More specifically, an increase in the frame width is accommodated by adding zero-wheel blocks to the first stage, increasing the number of zeroes zero-wheeled by the zero-wheeling blocks of the second stage, and by modifying and adding zero-wheel blocks to the third stage as appropriate. Notably, these modifications do not increase the delay across each stage or introduce new stages—the modifications would only increase the number of operations that occur in parallel. Thus the CRC circuit is scalable in a manner that does not increase the latency with which CRC values are calculated.

It should be understood that many variations are possible based on the disclosure herein. Although features and elements are described above in particular combinations, each feature or element may be used alone without the other features and elements or in various combinations with or without other features and elements. For instance, the size of various elements (e.g., frame or chunk) could be varied, the generator polynomial of the CRC circuits and the zero-wheeling circuits could be varied, and the bit-size output for the CRC blocks could be varied. Additionally, any number of CRC circuits (400, 500, or 600) may be included to process CRC data from Ethernet packets in parallel. Duplicate CRC circuits may process data from different packets in parallel.

The methods provided may be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors may be manufactured by configuring a manufacturing process using the results of processed hardware description language (HDL) instructions and other intermediary data including netlists (such instructions capable of being stored on a computer readable media). The results of such processing may be maskworks that are then used in a semiconductor manufacturing process to manufacture a processor which implements aspects of the embodiments.

The methods or flow charts provided herein may be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:
1. A method for determining a final cyclic redundancy check ("CRC") value of a multi-frame packet, the method comprising:
generating a first CRC value for a first frame of the multi-frame packet;
converting the first CRC value to a first zero-wheeled CRC value;
generating a second CRC value for a second frame of the multi-frame packet; and outputting the final CRC value for the multi-frame packet that is based on the first zero-wheeled CRC value and the second CRC value.

2. The method of claim 1, wherein generating the first CRC value comprises:
generating a first chunk zero-wheeled CRC value that comprises a CRC value determined for a first chunk of the first frame followed by a number of zeroes equal to the number of bits following the first chunk in the first frame;
generating a second chunk zero-wheeled CRC value that comprises a CRC value determined for a second chunk of the first frame followed by a number of zeroes equal to the number of bits following the second chunk in the first frame; and
performing an XOR operation on data including the first chunk zero-wheeled CRC value and the second chunk zero-wheeled CRC value to generate the first CRC value.

3. The method of claim 2, wherein:
generating the first chunk zero-wheeled CRC value comprises:
generating a first chunk CRC value for the first chunk, and
converting the first chunk CRC value to the first chunk zero-wheeled CRC value; and
generating the second chunk zero-wheeled CRC value comprises:
generating a second chunk CRC value for the second chunk, and
converting the second chunk CRC value to the second chunk zero-wheeled CRC value.

4. The method of claim 1, further comprising:
generating a first running CRC value by performing an XOR operation on the first zero-wheeled CRC value and the second CRC value, the first zero-wheeled CRC value being a CRC value determined for the first frame concatenated with a number of zeroes equal to a frame width.

5. The method of claim 4, wherein:
a final frame of the multi-frame packet includes an end byte that is not aligned with the last byte of the final frame, and, the method further comprises:
converting the first running CRC value to a final zero-wheeled value, the final zero-wheeled value being a CRC value determined for the first running CRC value concatenated with a number of zeroes equal to the number of bits up to the end byte of the multi-frame packet in the final frame;
generating a final CRC frame value for the final frame; and
generating the final CRC value by performing an XOR operation on the final CRC frame value and the final zero-wheeled value.

6. The method of claim 5, further comprising:
delaying the final CRC frame value by one clock cycle before generating the final CRC value.

7. The method of claim 4, wherein:
a final frame of the multi-frame packet includes an end byte that is aligned with the last byte of the final frame; and
the final CRC value comprises the first running CRC value.

8. The method of claim 1, further comprising:
generating a frame CRC value for each frame of the multi-frame packet;
accumulating each frame CRC value, zero-wheeled by a number of bits equal to a frame width, to generate running CRC values; and
responsive to detecting a final frame of the multi-frame packet, performing an XOR operation on a final running CRC value and a final CRC frame value to generate the final CRC value.

9. The method of claim 1, wherein:
the second frame comprises a final frame of the multi-frame packet; and
converting the first CRC value to a first zero-wheeled CRC value comprises converting the first CRC value to a value that is equal to a CRC value of the first frame concatenated with the number of zeroes up to end byte of the final frame.

10. A cyclic redundancy check ("CRC") circuit for determining a CRC of a multi-frame packet, comprising:
a first stage configured to:
generate a first CRC value for a first frame of the multi-frame packet, and
generate a second CRC value for a second frame of the multi-frame packet; and
a second stage configured to:
convert the first CRC value to a first zero-wheeled CRC value,
wherein the final CRC value for the multi-frame packet is based on the first zero-wheeled CRC value and the second CRC value.

11. The CRC circuit of claim 10, wherein the first stage is configured to generate the first CRC value by:
generating a first chunk zero-wheeled CRC value that comprises a CRC value determined for a first chunk of the first frame followed by a number of zeroes equal to the number of bits following the first chunk in the first frame;
generating a second chunk zero-wheeled CRC value that comprises a CRC value determined for a second chunk of the first frame followed by a number of zeroes equal to the number of bits following the second chunk in the first frame; and
performing an XOR operation on data including the first chunk zero-wheeled CRC value and the second chunk zero-wheeled CRC value to generate the first CRC value.

12. The CRC circuit of claim 11, wherein the first stage is configured to:
generate the first chunk zero-wheeled CRC value by:
generating a first chunk CRC value for the first chunk, and
converting the first chunk CRC value to the first chunk zero-wheeled CRC value; and
generate the second chunk zero-wheeled CRC value by:
generating a second chunk CRC value for the second chunk, and
converting the second chunk CRC value to the second chunk zero-wheeled CRC value.

13. The CRC circuit of claim 10, wherein the second stage is further configured to:
generate a first running CRC value by performing an XOR operation on the first zero-wheeled CRC value and the second CRC value, the first zero-wheeled CRC value being a CRC value determined for the first frame concatenated with a number of zeroes equal to a frame width.

14. The CRC circuit of claim 10, wherein:
a final frame of the multi-frame packet includes an end byte that is not aligned with the last byte of the final frame;
the first stage is further configured to generate a final CRC frame value for the final frame;
the CRC circuit further comprises a third stage configured to:
  convert the first running CRC value to a final zero-wheeled value, the final zero-wheeled value being a CRC value determined for the first running CRC value concatenated with a number of zeroes equal to the number of bits up to the end byte of the multi-frame packet in the final frame; and
the CRC circuit further comprises a final XOR gate configured to generate the final CRC value by performing an XOR operation on the final CRC frame value and the final zero-wheeled value.

15. The CRC circuit of claim 14, further comprising:
a delay match block configured to delay the final CRC frame value by one clock cycle before generating the final CRC value.

16. The CRC circuit of claim 10, wherein:
the first stage is further configured to generate a frame CRC value for each frame of the multi-frame packet; and
the second stage is further configured to accumulate each frame CRC value, zero-wheeled by a number of bits equal to the size of each frame, to generate running CRC values,
wherein the final CRC frame is based on the running CRC values and the final frame CRC value.

17. The CRC circuit of claim 10, wherein:
the second frame comprises a final frame of the multi-frame packet; and
the second stage is configured to convert the first CRC value to a first zero-wheeled CRC value comprises converting the first CRC value to a value that is equal to a CRC value of the first frame concatenated with the number of zeroes up to an end byte of the final frame.

18. A non-transitory computer-readable medium that, when executed by a processor, causes the processor to perform a method for determining a final cyclic redundancy check ("CRC") value of a multi-frame packet, the method comprising:
  generating a first CRC value for a first frame of the multi-frame packet;
  converting the first CRC value to a first zero-wheeled CRC value;
  generating a second CRC value for a second frame of the multi-frame packet; and
  outputting the final CRC value for the multi-frame packet that is based on the first zero-wheeled CRC value and the second CRC value.

19. The non-transitory computer-readable medium of claim 18, wherein generating the first CRC value comprises:
  generating a first chunk zero-wheeled CRC value that comprises a CRC value determined for a first chunk of the first frame followed by a number of zeroes equal to the number of bits following the first chunk in the first frame;
  generating a second chunk zero-wheeled CRC value that comprises a CRC value determined for a second chunk of the first frame followed by a number of zeroes equal to the number of bits following the second chunk in the first frame; and
  performing an XOR operation on data including the first chunk zero-wheeled CRC value and the second chunk zero-wheeled CRC value to generate the first CRC value.

20. The non-transitory computer-readable medium of claim 19, wherein generating the first chunk zero-wheeled CRC value comprises:
  generating a first chunk CRC value for the first chunk, and
  converting the first chunk CRC value to the first chunk zero-wheeled CRC value; and
  generating the second chunk zero-wheeled CRC value comprises:
  generating a second chunk CRC value for the second chunk, and
  converting the second chunk CRC value to the second chunk zero-wheeled CRC value.

* * * * *